US011765869B1

(12) United States Patent
Magcale

(10) Patent No.: US 11,765,869 B1
(45) Date of Patent: *Sep. 19, 2023

(54) SELF-SUSTAINED, SCALABLE, EFFICIENT DATA CENTER FACILITY AND METHOD

(71) Applicant: Nautilus TRUE, LLC, Pleasanton, CA (US)

(72) Inventor: Arnold Castillo Magcale, San Ramon, CA (US)

(73) Assignee: Nautilus TRUE, LLC, San Ramon, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/381,182

(22) Filed: Jul. 20, 2021

Related U.S. Application Data

(63) Continuation of application No. 16/211,034, filed on Dec. 5, 2018, now Pat. No. 11,102,915, which is a
(Continued)

(51) Int. Cl.
*H05K 7/20* (2006.01)
*G06F 1/3203* (2019.01)

(52) U.S. Cl.
CPC ....... *H05K 7/20836* (2013.01); *G06F 1/3203* (2013.01); *H05K 7/20272* (2013.01); *H05K 7/20281* (2013.01); *H05K 7/20781* (2013.01)

(58) Field of Classification Search
CPC .......... H05K 7/20781; H05K 7/20836; H05K 7/20272; H05K 7/20281; G06F 1/3203
See application file for complete search history.

(56) References Cited

U.S. PATENT DOCUMENTS 6,212,895 B1 4/2001 Richardson
6,990,395 B2 1/2006 Ransom et al.
(Continued)

FOREIGN PATENT DOCUMENTS

JP 2010269641 A 12/2010
WO WO-2009055368 A2 4/2009
(Continued)

OTHER PUBLICATIONS

Cole. Data Center Infrastructure Management (DCM). Data Center Knowledge. (Website.) Mar. 2013. Retrieved at URL: http://www.nolimitssoftware.com/wp-content/uploads/2013/03/DCIM-Guide.pdf. 17 pages.
(Continued)

*Primary Examiner* — Chun Cao
(74) *Attorney, Agent, or Firm* — Wilson Sonsini Goodrich & Rosati

(57) ABSTRACT

Systems and methods disclose self-contained data center facility operations, management and build comprising, in the data center facility, installing a plurality of computer servers contained in a corresponding plurality of configurable rack mounted containers, a single or plurality of heat exchangers operatively coupled to the configurable rack mounted containers, and comprised in a thermal heat exchange system which further comprises a closed loop cooling unit. The closed loop cooling unit is caused to absorb heat from the single or plurality of heat exchangers. Additionally, systems and methods disclosed include power management functionality operatively coupled to control functionality, wherein the power management functionality is configured to assess a data center power requirement, and to draw and supply power based on the assessed requirement, and wherein the data center control unit is configured to calculate a data center environment, infrastructure and component condi-
(Continued)

tion, and based on the calculated condition, control the environment, infrastructure and component condition for optimal efficiency.

16 Claims, 2 Drawing Sheets

Related U.S. Application Data continuation of application No. 14/959,691, filed on Dec. 4, 2015, now Pat. No. 10,178,810.

(56) References Cited

U.S. PATENT DOCUMENTS

| | | | |
|---|---|---|---|
| 7,058,710 | B2 | 6/2006 | McCall et al. |
| 7,278,273 | B1 | 10/2007 | Whitted et al. |
| 7,318,322 | B2* | 1/2008 | Ota .................... H05K 7/20781 |
| | | | 62/305 |
| 7,525,207 | B2 | 4/2009 | Clidaras et al. |
| 7,738,251 | B2 | 6/2010 | Clidaras et al. |
| 8,359,191 | B2 | 1/2013 | Chen et al. |
| 8,853,872 | B2 | 10/2014 | Clidaras et al. |
| 10,178,810 | B1 | 1/2019 | Magcale et al. |
| 11,102,915 | B1* | 8/2021 | Magcale ............ G05D 23/1917 |
| 2002/0010709 | A1 | 1/2002 | Culbert et al. |
| 2004/0221604 | A1* | 11/2004 | Ota .................... H05K 7/20781 |
| | | | 361/691 |
| 2006/0259201 | A1 | 11/2006 | Brown |
| 2007/0213000 | A1 | 9/2007 | Day |
| 2007/0281639 | A1 | 12/2007 | Clidaras et al. |
| 2009/0037268 | A1 | 2/2009 | Zaid et al. |
| 2009/0083126 | A1 | 3/2009 | Koren et al. |
| 2009/0084297 | A1 | 4/2009 | Choi et al. |
| 2009/0126910 | A1 | 5/2009 | Campbell et al. |
| 2009/0207567 | A1 | 8/2009 | Campbell et al. |
| 2009/0299824 | A1 | 12/2009 | Barnes, Jr. |
| 2010/0298997 | A1 | 11/2010 | Ohba et al. |
| 2011/0060470 | A1 | 3/2011 | Campbell et al. |
| 2011/0072293 | A1 | 3/2011 | Mazzaferri et al. |
| 2011/0132579 | A1* | 6/2011 | Best ........................ H05K 7/20 |
| | | | 165/104.31 |
| 2011/0207391 | A1 | 8/2011 | Hamburgen et al. |
| 2011/0240281 | A1* | 10/2011 | Avery ................ H05K 7/20836 |
| | | | 62/476 |
| 2012/0042263 | A1 | 2/2012 | Rapaport et al. |
| 2012/0136998 | A1 | 5/2012 | Hough et al. |
| 2012/0166433 | A1 | 6/2012 | Tseng |
| 2012/0166616 | A1 | 6/2012 | Meehan et al. |
| 2012/0266007 | A1 | 10/2012 | Menon et al. |
| 2013/0128455 | A1* | 5/2013 | Koblenz ............ H05K 7/20836 |
| | | | 165/294 |
| 2013/0238795 | A1 | 9/2013 | Geffin et al. |
| 2014/0006594 | A1* | 1/2014 | Gabriel .................. H04L 43/10 |
| | | | 709/224 |
| 2014/0259618 | A1 | 9/2014 | Damus et al. |
| 2015/0013940 | A1* | 1/2015 | Best .................... H05K 7/20381 |
| | | | 165/80.4 |
| 2015/0088586 | A1* | 3/2015 | Pavlas ................ G06F 9/45558 |
| | | | 718/1 |
| 2015/0121113 | A1* | 4/2015 | Ramamurthy ............ G06F 1/30 |
| | | | 713/340 |
| 2015/0227181 | A1* | 8/2015 | Khessib ................ G06F 1/3203 |
| | | | 713/300 |
| 2016/0157388 | A1* | 6/2016 | Belady ............... H05K 7/20763 |
| | | | 700/282 |
| 2016/0286689 | A1* | 9/2016 | Wu ..................... H05K 7/20772 |
| 2017/0220061 | A1* | 8/2017 | Magcale .................... F16B 9/05 |

FOREIGN PATENT DOCUMENTS

| | | |
|---|---|---|
| WO | WO-2010129341 A1 | 11/2010 |
| WO | WO-2012047746 A2 | 4/2012 |
| WO | WO-2013113138 A1 | 8/2013 |

OTHER PUBLICATIONS

U.S. Appl. No. 14/959,691 Corrected Notice of Allowability dated Sep. 18, 2018.
U.S. Appl. No. 14/959,691 Notice of Allowance dated Sep. 5, 2018.
U.S. Appl. No. 14/959,691 Office Action dated Apr. 19, 2018.
U.S. Appl. No. 14/959,691 Office Action dated Sep. 20, 2017.
U.S. Appl. No. 16/211,034 Notice of Allowance dated Apr. 20, 2021.
U.S. Appl. No. 16/211,034 Office Action dated Mar. 30, 2020.
U.S. Appl. No. 16/211,034 Office Action dated Oct. 2, 2020.

* cited by examiner

SELF-SUSTAINED, SCALABLE, EFFICIENT DATA CENTER FACILITY AND METHOD

CROSS REFERENCE TO RELATED APPLICATIONS

This application is a continuation of application Ser. No. 16/211,034 filed Dec. 5, 2018, and entitled "SELF-SUSTAINED, SCALABLE, EFFICIENT DATA CENTER FACILITY AND METHOD" which in turn is a continuation of application Ser. No. 14/959,691 filed Dec. 4, 2015, and entitled "SCALED DOWN, EFFICIENT DATA CENTER" which are hereby incorporated by reference in the respective entirety of each.

TECHNICAL FIELD

The present invention relates to low cost, energy efficient data center facilities, intelligent power management, and data recovery facilities.

BACKGROUND

A data center is a facility designed to house, maintain, and power a plurality of computer systems. A conventional data center is constructed entirely on-site with installation of all electrical, mechanical and cooling equipment performed on-site after construction of the data center facility is completed. Traditional data center deployment methods require extensive time for planning and construction. All electrical, mechanical and cooling systems are fabricated and constructed on-site after the construction of the data center facility building has been completed. After the data center construction has been completed, installing racks to house the computer systems is another time consuming effort that may take additional weeks to complete.

Typical Data Centers are large in surface area and are energy intensive. In some instances, for security or location reasons, or due to space constraints, there is a requirement to have a Data Center that provides communities with dedicated computation resources. There is also a need to have data centers that are energy efficient, and self-contained. Some of the locations where these data centers are deployed include private residences, high rise buildings, small business parks, ships or other marine vessels, airplanes, submarines, and other land, water, air, and space based vessels. In order to increase efficiencies and reduce costs, a number of standalone data center elements need be combined to address demands for compactness and simplicity. In an example embodiment, a heat exchanger is embedded in a closed loop cooling unit piping. In additional embodiments, automation systems that control cooling, power, etc. and that are configured to automate such control based on information gathered via sensors, is configured to automate the control based on algorithmic manipulations. Embodiments disclosed address these and other hitherto unaddressed needs.

The described methods and systems include use of everyday appliances such as water heaters, with a heat exchange embedded into pipes or hanging off the water heater, and stripped down automation system that would allow artificial intelligence controlling of a scaled down data center through signal averaging and simulation of the particular building to be a more cost effective solutions.

SUMMARY

The following presents a simplified summary relating to one or more aspects and/or embodiments disclosed herein. As such, the following summary should not be considered an extensive overview relating to all contemplated aspects and/or embodiments.

An embodiment includes a self-sustained data center facility comprising a single or plurality of rear door heat exchangers operatively coupled to a corresponding single or plurality of containers containing a plurality of computer servers, and comprising a thermal heat exchange system which further comprises a closed loop coolant distribution unit. Preferably, a power management unit is operatively coupled to a control unit wherein a power requirement is assessed based on a calculated environment, infrastructure and component condition, and based on the calculated condition, the control unit self configures to calibrate the environment, infrastructure and component condition. According to an embodiment, calibration of the environment, infrastructure and component condition comprises analyzing if the water temperature and water flow is within a pre-defined range, and based on the analysis, adjusting a plurality of adjustable flow control valves to moderate the water flow and thereby adjust the water temperature to within the pre-defined range. Calibration further comprises controlling a plurality of virtual machine instances, which comprises automatically managing the plurality of virtual machine instances, killing a single of plurality of virtual servers or ban physical computer systems during low application loads, and instantiating the said virtual servers or physical computer systems prior to expected peak loads.

One general aspect includes a self-sustained, data center facility including: in the computer data center, a plurality of computer servers contained in a corresponding plurality of reconfigurable rack mounted containers; a single or plurality of heat exchangers operatively coupled to the reconfigurable rack mounted containers; a thermal heat exchange system including the single or plurality of heat exchangers, and further including a closed loop cooling means. According to an embodiment of the self-sustained, data center facility the closed loop cooling means is caused to absorb heat from the single or plurality of heat exchangers. The self-sustained, data center also includes a power management unit operatively coupled to a data center control unit. The power management unit is configured to assess a data center power requirement, and to draw and supply power based on the assessed requirement. The self-sustained data center facility also includes a control unit configured to assess a data center environment, infrastructure and component condition, and based on the assessed condition, control the environment, infrastructure and component condition for optimal efficiency. Other embodiments of this aspect include corresponding computer systems, apparatuses, and computer programs recorded on one or more computer storage devices, each configured to perform the actions of the methods.

Implementations may include one or more of the following features. The data center control unit further includes a software management suite configured to collect the environment, infrastructure and component condition data via a plurality of wireless sensors, and to automatically enable dynamic data center operation actions for migrating application loads and power loads to another data center, over a network. According to an embodiment, the plurality of reconfigurable rack mounted containers are included in a plurality of reconfigurable data center modules. According to an embodiment of the facility, the data center control unit comprising the software management suite further includes a plurality of analytic engines configured to analyze data from a plurality of infrastructure systems, components, wireless sensors, application services, power distribution components, virtual machines, facility infrastructure and utility energy markets. The facility may also include based on the collected analyzed data, applications to make data center operational state changes for application load balancing or power load balancing across multiple data centers. The facility may also include data collected from energy markets used to automatically manage data center and application disaster recovery from utility energy market outages, which includes moving applications and power loads from one data center to another, enabling disaster recovery from utility energy market outages. According to an embodiment of the facility, the closed loop cooling means includes a water based closed loop cooling system further including: a single or plurality of filtered water intake pipes and water exhaust pipes; a single or plurality of coolant heat exchange piping, and coolant distribution piping; a coolant distribution unit; and where the coolant distribution unit is caused to circulate coolant through the coolant heat exchange piping, and where water pumped from the surrounding environment through the filtered water intake pipes is caused to absorb heat from the heated coolant via the single or plurality of heat exchangers. Preferably, the closed loop coolant distribution unit is operatively coupled to the data center modules via the single or plurality of heat exchangers. Implementations of the described techniques may include hardware, a method or process, or computer software on a computer accessible medium.

Embodiments disclosed include, in a data center facility, a centralized computer implemented method comprising collecting environment, infrastructure and component data, and based on the collected data, analyzing if a water temperature and water flow in a coolant distribution unit is within a pre-defined range, and based on the analysis, adjusting a plurality of adjustable flow control valves comprised in the coolant distribution unit to moderate the water flow and thereby adjust the water temperature to within the pre-defined range. An embodiment of the method includes controlling a single or plurality of virtual machine instances comprised in the data center facility, controlling a power supply from a single or plurality of power sources based on a calculated environment, infrastructure and component condition, calculated by a control unit, and collecting data from a plurality of energy markets. Preferably, based on the collected data, the control unit is instrumental in controlling data center operation state changes.

DETAILED DESCRIPTION

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

An embodiment includes, in a data center, a centralized computer system configured to collect environment, infrastructure and component data. Based on the collected data the computer system is configured to control a water flow and a coolant flow through a closed loop cooling system comprised in a reconfigurable thermal containment system. The system is further configured to control airflow through a thermal airflow system, and to control a single or plurality of virtual machine instances comprised in the data center. Additionally, the system can be configured to collect data from a plurality of energy markets, accordingly, control a power supply from a single or plurality of power sources, and based on the collected data, control data center operation state changes.

According to an embodiment, the system is further configured to collect environmental data from a plurality of wireless sensors. Additional configurations allow the computer system to collect infrastructure system and component data from infrastructure elements wherein said infrastructure system and component data comprise air temperature data, air flow data, water temperature data and water flow data.

According to an embodiment the computer system is configured to control the infrastructure system and components' operational states for optimal efficiency.

Figure 1:
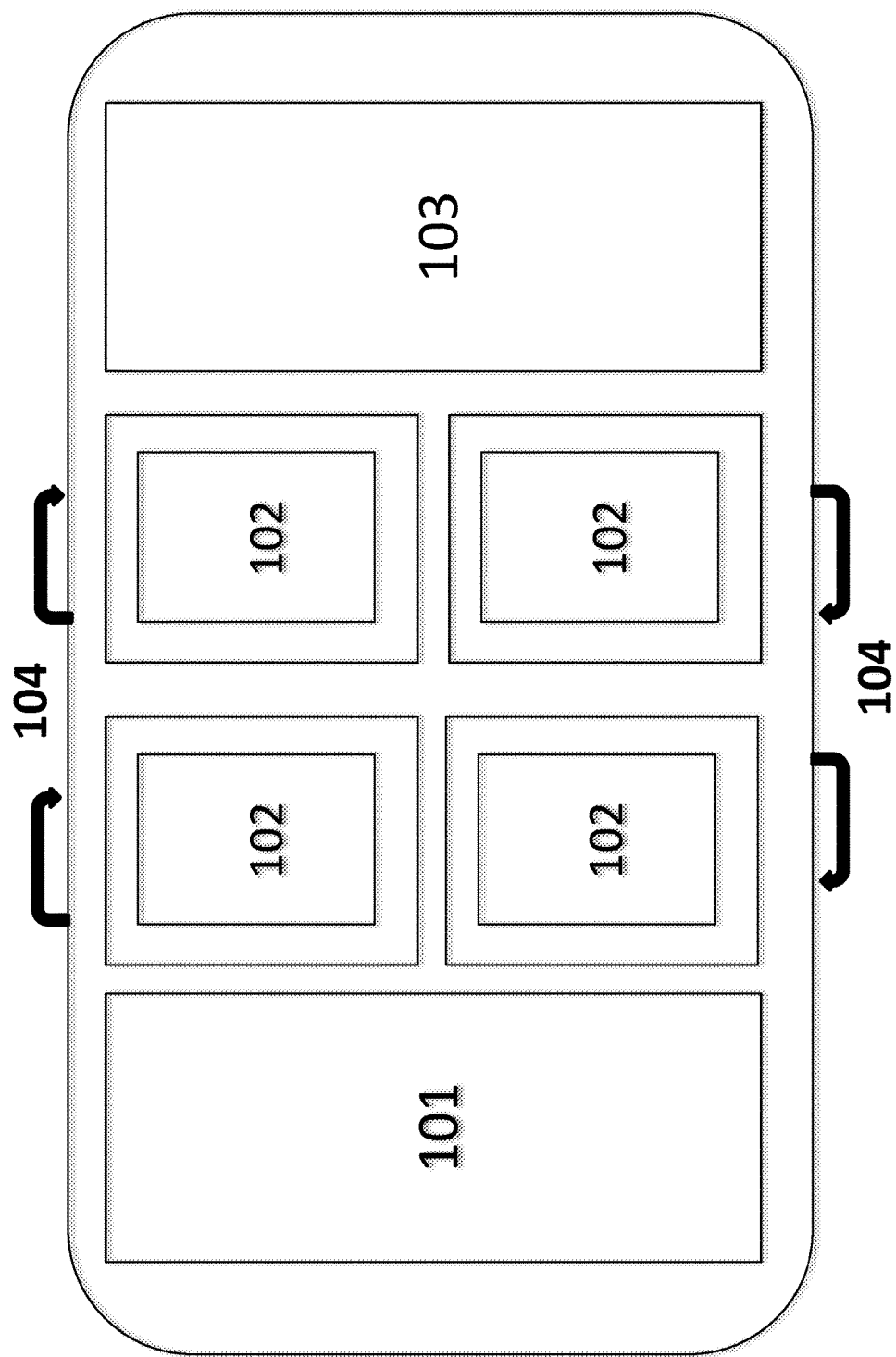
FIG. 1 illustrates the components of a data center facility according to an embodiment.

FIG. 1 illustrates the components of a data center facility according to an embodiment. Data center facility illustrated in FIG. 1 includes power and control unit 101, configurable racks and containers 102 for housing server systems, closed loop cooling unit 103, and water inlet and outlet pipes 104 coupled to or comprising embedded heat exchange apparatus.

In a preferred embodiment, in said control of airflow, the system is configured to analyze if an ambient air temperature is within a pre-defined range, and based on the analysis, the computer system can automatically make zero or more adjustments to at least one of a computer room air conditioner (CRAC), a rear door heat exchanger (RDHX), a coolant distribution unit (CDU), a single or plurality of variable frequency drive (VFD) fans and a single or plurality of automated, adjustable flow control valves, to bring the ambient air temperature to within the pre-defined range.

Additional embodiments include configuration capabilities wherein the system is configured to, in the said control of water flow, analyze if the water temperature and water flow is within a pre-defined range, and based on the analysis, make zero or more adjustments to at least one of a coolant distribution unit (CDU), a rear door heat exchanger (RDHX), a single or plurality of automated, adjustable flow control valves, and a single or plurality of variable frequency drive (VFD) pumps to bring the water flow and the water temperature to within the pre-defined range.

An embodiment includes configurations to automatically manage the virtual machine instances, which comprises a capability to kill a single of plurality of virtual servers or banks of physical computer systems during low application loads, and to instantiate the said virtual machines or banks of physical computer systems prior to expected peak loads.

Additional embodiments include communication capability over a network with a plurality of data centers and energy markets. This communication capability provides remote configuration capability as well. Alternate embodiments enable, in control of data center operation state changes, control of at least one of application load balancing and power load balancing across a plurality of data centers over a wired or wireless network.

Embodiments disclosed include, in a data center facility, a centralized computer implemented method comprising, collecting environment, infrastructure and component data. Based on the collected data, the method includes controlling a water flow and a coolant flow through a closed loop cooling unit comprised in a thermal containment system. According to an embodiment, the closed loop cooling unit causes sealed coolant to flow through one side of a heat exchanger and water drawn from the filtered water intake pipes to flow through another side of the heat exchanger before the drawn water is ejected through the filtered water exhaust pipes. Further the method comprises controlling airflow through a thermal airflow system, and controlling a single or plurality of virtual machine instances comprised in the data center facility. Additional embodiments include controlling a power supply from a single or plurality of power sources and collecting data from a plurality of energy markets, and based on the collected data, controlling data center operation state changes.

The method further comprises collecting the said environmental data from a plurality of wireless sensors and collecting the said infrastructure system and component data from a single or plurality of infrastructure elements.

In a preferred embodiment, the method optimizes efficiency based on the controlling of the infrastructure system and components' operational states. In controlling virtual machine instances, embodiments are configured for automatically managing the virtual machine instances, killing a single of plurality of virtual servers or banks of physical computer systems during low application loads, and even instantiating the said virtual machines or banks of physical computer systems prior to expected peak loads. In controlling of data center operation state changes, the data center facility is configured for controlling at least one of application load balancing and power load balancing across a plurality of data centers over a wired or wireless network. A plurality of connected graphical user interfaces enable displaying of the collected and analyzed data to a single or plurality of users interconnected over a network. Preferably, the data center facility is configurable over the network.

Figure 2:
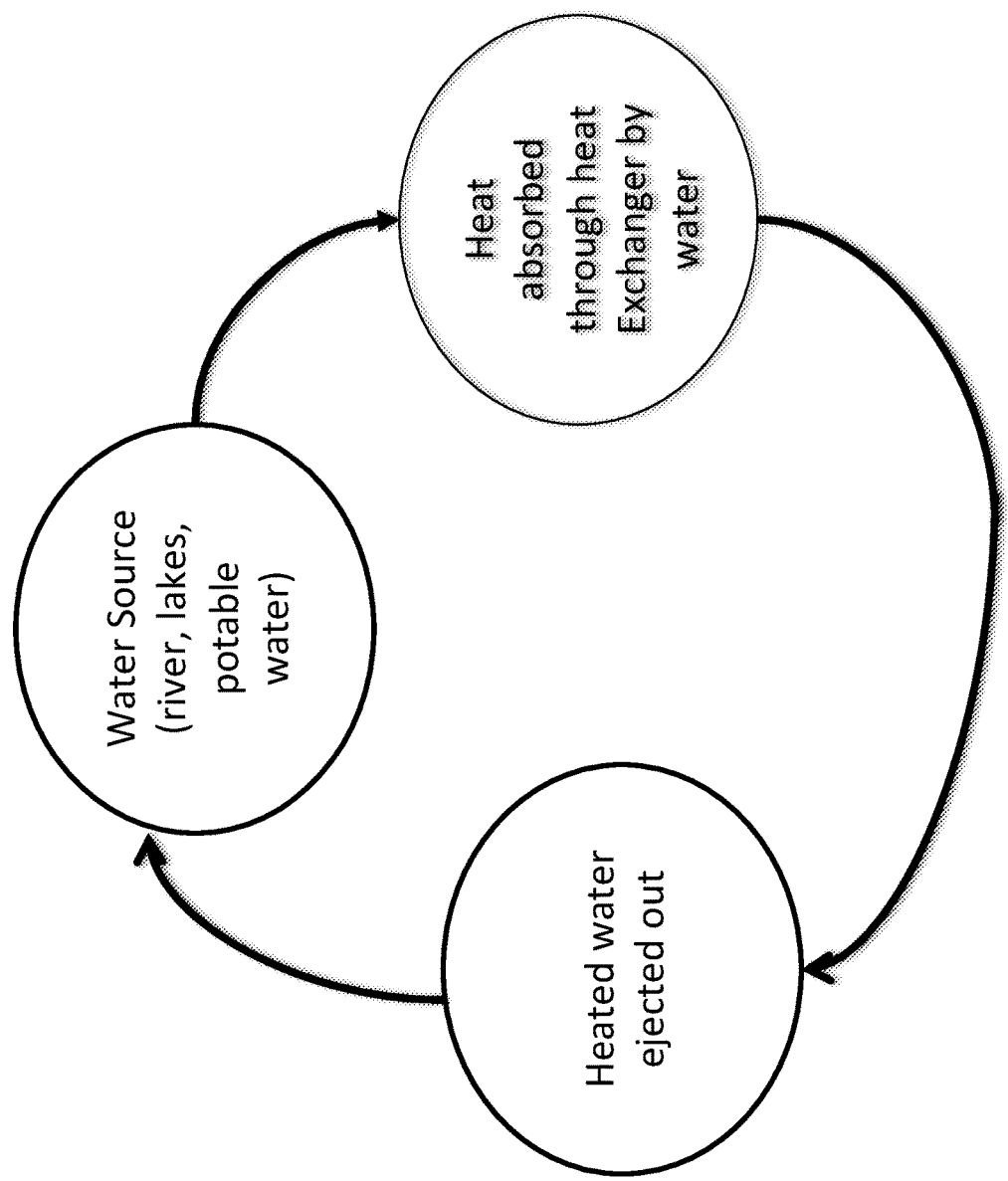
FIG. 2 illustrates cooling management of the data center facility according to an embodiment.

FIG. 2 illustrates cooling management of the data center facility according to an embodiment. In step 201 water is drawn from a water source by filtered water intake pipes. In step 202 the water flowing through the pipes is caused to absorb dissipated heat captured by the heat exchanger. And in step 203, the heat absorbing water is ejected through water outflow pipes.

Embodiments disclosed include systems and methods for deployment of data center facilities in constrained spaces like private residences, high rise buildings, small business parks, ships or other marine vessels, airplanes, submarines, and other land, water, air, and space based vessels, empowering communities with dedicated computation resources. Embodiments disclosed include systems and methods for extremely cost efficient and energy efficient self-contained data center facilities. Embodiments disclosed include systems and methods for combining standalone data center facility elements to address demands for compactness and simplicity. Embodiments enable embedding of heat exchanger properties in closed loop cooling unit piping. Embodiments further enable automation systems that control cooling, power, etc. and that are configured to automate such control based on information gathered via sensors, and without sensors, are configured to automate the control based on algorithmic manipulations.

Aspects of the present disclosure can be practiced with a variety of computer system and computer network configurations, including hand-held devices, multiprocessor systems, microprocessor based or programmable consumer electronics, minicomputers, mainframe computers, and the like. In addition, aspects of the present disclosure can be practiced in distributed computing environments where tasks are performed by remote processing devices that are linked through a communications network to the data center facility. Aspects of the present disclosure can, therefore, be implemented in connection with various hardware, software or combinations thereof, in a computer system or other processing system.

Any of the methods described herein can include machine readable instructions for execution by: (a) a processor, (b) a controller, and/or (c) any other suitable processing device. Any algorithm, software, or method disclosed herein can be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well-known manner (e.g., it can be implemented by an application specific integrated circuit (ASIC), a programmable logic device (PLD), a field programmable logic device (FPLD), discrete logic, etc.).

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

What is claimed is:

1. A data center facility comprising:
   a software management suite configured to:
   collect and analyze data from a plurality of sensors, a power management system operatively coupled to the software management suite, a plurality of virtual machine instances, and a plurality of utility energy markets;
   based on the collected analyzed data, make data center operational state changes;
   control the plurality of virtual machine instances, wherein the software management suite is configured to kill a single or plurality of virtual servers and disable physical computer systems during low application loads, and instantiate the said virtual servers and enable the physical computer systems prior to expected peak loads; and
   based on data collected from utility energy markets, automatically manage data center and application disaster recovery from utility energy market outages, which comprises moving applications and power loads from one data center to another; and
   wherein a power requirement is assessed based on a calculated environment, infrastructure and component condition, and based on the calculated condition, the software management suite calibrates the environment, infrastructure and component condition;
   wherein calibration of the environment, infrastructure and component condition comprises:
   analyzing if a water temperature and water flow through a configurable thermal heat exchange system is within a pre-defined range, and based on the analysis, configuring the thermal heat exchange system by adjusting a plurality of adjustable flow control valves to moderate the water flow and thereby adjust the water temperature to within the pre-defined range.

2. The data center facility of claim 1 wherein the software management suite is configured to extract the environment, infrastructure and component condition data via the plurality of sensors, and to automatically enable dynamic data center operation actions for migrating application loads and power loads to another data center, over a network.

3. The data center facility of claim 1 wherein the software management suite further comprises:
a plurality of analytic engines configured to: collect and analyze data from the plurality of sensors, power distribution components, virtual machines, and utility energy markets; and
based on the collected analyzed data, make data center operational state changes across multiple data centers.

4. The data center facility of claim 1 wherein the facility is configurable over a secure network.

5. The data center facility of claim 1 wherein:
the configurable thermal heat exchange system is comprised in a heat exchanger operatively coupled to a container containing a plurality of computer servers;
the configurable thermal heat exchange system comprises a closed loop coolant distribution unit comprising:
a single or plurality of coolant heat exchange piping, and coolant distribution piping operatively coupled to a single or plurality of corresponding filtered water intake pipes and water exhaust pipes in an open loop; and
wherein the coolant distribution unit is caused to circulate sealed coolant through the coolant heat exchange piping, and wherein water pumped through the filtered water intake pipes is caused to absorb heat from the circulated sealed coolant.

6. The data center facility of claim 1, wherein the calculated environment, infrastructure and component condition, is based on one or more of ambient air temperature data, air flow data, water temperature data, and water flow data.

7. The data center facility of claim 1, wherein the software management suit is configured to analyze if an ambient air temperature is within a pre-defined range.

8. The data center facility of claim 7, wherein calibration of the environment, infrastructure and component condition comprises: based on the analysis of the ambient air temperature, automatically making zero or more adjustments to at least one of a computer room air conditioner (CRAC), a rear door heat exchanger (RDHX), a coolant distribution unit (CDU), a single or plurality of variable frequency drive (VFD) fans and a single or plurality of automated, adjustable flow control valves, to bring the ambient air temperature to within the pre-defined range.

9. In a data center facility, a method comprising:
via a software management suite:
collecting and analyzing data from a plurality of sensors, a power management system operatively coupled to the software management suite, a plurality of virtual machine instances, and a plurality of utility energy markets;
based on the collected analyzed data, making data center operational state changes;
controlling the plurality of virtual machine instances, wherein the software management suite is configured to kill a single or plurality of virtual servers and disable physical computer systems during low application loads, and instantiate the said virtual servers and enable the physical computer systems prior to expected peak loads;
based on data collected from utility energy markets, automatically managing data center and application disaster recovery from utility energy market outages, which comprises moving applications and power loads from one data center to another; and
assessing a power requirement based on a calculated environment, infrastructure and component condition, and based on the calculated condition, calibrating by the software management suite, the environment, infrastructure and component condition; and
wherein calibrating the environment, infrastructure and component condition comprises:
analyzing if a water temperature and water flow through a configurable thermal heat exchange system is within a pre-defined range, and based on the analysis, configuring the thermal heat exchange system by adjusting a plurality of adjustable flow control valves to moderate the water flow and thereby adjusting the water temperature to within the pre-defined range.

10. The method of claim 9 further comprising:
extracting by the software management suite, the environment, infrastructure and component condition data via the plurality of sensors, and automatically enabling dynamic data center operation actions for migrating application loads and power loads to another data center, over a network.

11. The method of claim 9 further comprising:
via a plurality of analytic engines comprised in the software management suite:
collecting and analyzing data from the plurality of sensors, power distribution components, virtual machines, and utility energy markets; and
based on the collected analyzed data, making data center operational state changes across multiple data centers.

12. The method of claim 9 wherein the facility is configurable over a secure network.

13. The method of claim 9 wherein:
the configurable thermal heat exchange system is comprised in a heat exchanger operatively coupled to a container containing a plurality of computer servers;
the configurable thermal heat exchange system comprises a closed loop coolant distribution unit comprising:
a single or plurality of coolant heat exchange piping, and coolant distribution piping operatively coupled to a single or plurality of corresponding filtered water intake pipes and water exhaust pipes in an open loop; and
wherein the coolant distribution unit is caused to circulate sealed coolant through the coolant heat exchange piping, and wherein water pumped through the filtered water intake pipes is caused to absorb heat from the circulated sealed coolant.

14. The method of claim 9, wherein the calculated environment, infrastructure and component condition, is based on one or more of ambient air temperature data, air flow data, water temperature data, and water flow data.

15. The method of claim 14, further comprising analyzing if the ambient air temperature is within a pre-defined range.

16. The method of claim 15, wherein calibrating the environment, infrastructure and component condition comprises: based on the analysis of the ambient air temperature, automatically making zero or more adjustments to at least one of a computer room air conditioner (CRAC), a rear door heat exchanger (RDHX), a coolant distribution unit (CDU), a single or plurality of variable frequency drive (VFD) fans and a single or plurality of automated, adjustable flow control valves, to bring the ambient air temperature to within the pre-defined range.

\* \* \* \* \*